(12) United States Patent
Chang

(10) Patent No.: US 9,651,613 B2
(45) Date of Patent: May 16, 2017

(54) CIRCUIT BOARD TESTING SYSTEM

(71) Applicant: Primax Electronics Ltd., Neihu, Taipei (TW)

(72) Inventor: Pei-Ming Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 609 days.

(21) Appl. No.: 14/225,058

(22) Filed: Mar. 25, 2014

(65) Prior Publication Data

US 2015/0168452 A1 Jun. 18, 2015

(30) Foreign Application Priority Data

Dec. 17, 2013 (TW) .............................. 102146614 A

(51) Int. Cl.
*G01R 31/28* (2006.01)
(52) U.S. Cl.
CPC ................................ *G01R 31/2889* (2013.01)
(58) Field of Classification Search
CPC ........................ G01R 31/2889; G01R 31/2896
See application file for complete search history.

(56) References Cited

U.S. PATENT DOCUMENTS

| | | | | |
|---|---|---|---|---|
| 5,969,530 A * | 10/1999 | Yamashita | ......... | G01R 31/2805 324/523 |
| 6,339,236 B1 * | 1/2002 | Tomii | ................... | H03K 17/785 257/223 |
| 6,657,455 B2 * | 12/2003 | Eldridge | .......... | G01R 31/31721 324/602 |
| 7,005,876 B2 * | 2/2006 | Wei | ....................... | B81C 99/005 324/750.23 |
| 7,307,433 B2 * | 12/2007 | Miller | ................ | G01R 1/07385 324/756.03 |
| 7,528,507 B2 * | 5/2009 | Carson | ..................... | H02H 3/12 307/116 |
| 2008/0150562 A1 * | 6/2008 | Kumagai | ........... | G01R 31/2886 324/754.03 |
| 2010/0244880 A1 * | 9/2010 | Urabe | ................ | G01R 31/2889 324/762.01 |
| 2014/0179169 A1 * | 6/2014 | Wu | ....................... | H01R 12/721 439/630 |

* cited by examiner

*Primary Examiner* — Son Le
*Assistant Examiner* — Adam Clarke
(74) *Attorney, Agent, or Firm* — Kirton McConkie; Evan R. Witt

(57) ABSTRACT

A circuit board testing system includes a testing fixture and a computer system. The testing fixture includes a contact element, a switching circuit, a connection module, and a data acquisition unit. The contact element is connected with a circuit board. The switching circuit is connected with the contact element. The connection module is connected with the circuit board and the computer system. Consequently, an electric power is transmitted from the computer system to the circuit board through the connection module. By enabling the connection module, the data acquisition unit acquires a real voltage value corresponding to the electronic component. The computer system is connected with the testing fixture. According to the real resistance value, the computer system judges whether the electronic component passes the test.

5 Claims, 7 Drawing Sheets

CIRCUIT BOARD TESTING SYSTEM

FIELD OF THE INVENTION

The present invention relates to a testing system, and more particularly to a circuit board testing system.

BACKGROUND OF THE INVENTION

With increasing development of science and technology, electronic devices become more and more popular to personal users. The widely-used electronic device includes for example a computer host, a notebook computer, a mobile phone or any other appropriate portable electronic device. Moreover, a peripheral input device may be cooperatively used with the electronic device in order to enhance the operating flexibility of the electronic device. The peripheral input device includes for example a mouse device, a keyboard device or a trackball device.

As known, not only the electronic device but also the peripheral input device has a circuit board therein. Through the circuits and electronic components on the circuit board, the electronic device or the peripheral input device can be normally operated. Generally, in the fabrication of the electronic device or the peripheral input device, a testing method should be performed to realize whether the functions of the electronic device or the peripheral input device are normal or not. The testing method comprises a procedure of testing the circuit board before the electronic device or the peripheral input device is assembled and a procedure of testing the overall functions of the assembled electronic device or the assembled peripheral input device. By testing the circuit board, the manufacturer may realize whether any defects are present in the circuit board before the electronic device or the peripheral input device is assembled. If the procedure of testing the circuit board is not done and some defects are found after the electronic device or the peripheral input device is assembled, the manufacturer needs to disassemble the electronic device or the peripheral input device to debug the circuit board. It is time-consuming to disassemble the electronic device or the peripheral input device and debug the circuit board.

Generally, the method of testing the circuit board includes a static testing procedure and a dynamic testing procedure. The static testing procedure is a power-off testing procedure. In the power-off testing procedure, the electronic components on the circuit board are tested by interrupting the power to the circuit board. The electronic components are for example inductors, capacitors, resistors or any other electronic components with resistances. The dynamic testing procedure is a power-on testing procedure. In the power-on testing procedure, the functions of the electronic components on the circuit board are tested by providing the power to the circuit board.

In the static testing procedure of the circuit board, a contact probe of an electricity meter is used to sequentially measure the plural electronic components on the circuit board. In other words, the static testing procedure is both time-consuming and labor-intensive. After the circuit board is manually tested for a long time, the tester may feel tired. Consequently, the electronic components may be repeatedly measured, or the contact probe may fail to be accurately contacted with the electronic components to result in erroneous judgment. In other words, the conventional manual testing method is time-consuming, labor-intensive and prone to erroneous judgment.

The dynamic testing procedure of the circuit board is a power-on testing procedure. After the circuit board is powered on, the functions of the circuit board are tested. A conventional dynamic testing procedure will be illustrated as follows. Firstly, the circuit board is connected with the computer system by the tester. Consequently, the circuit board is powered on, and the circuit board is in communication with the computer system. In addition, the device information (including the identification information and the specification information) of the computer system and the circuit board may be exchanged between each other. After the circuit board is identified by the computer system, a contact probe of an electricity meter may be used to sequentially measure the voltage values of the electronic components on the circuit board. By judging whether the measured voltage values comply with a default range, the tester may determine whether the circuit board passes the test. The problems of the conventional manual dynamic testing procedure are similar to the problems of the conventional manual static testing procedure. Similarly, after the circuit board is manually tested for a long time, the tester may feel tired. Consequently, the electronic components may be repeatedly measured, or the contact probe may fail to be accurately contacted with the electronic components to result in erroneous judgment.

Therefore, there is a need of providing a cost-effective circuit board testing system without the manual measurement.

SUMMARY OF THE INVENTION

An object of the present invention provides a cost-effective circuit board testing system without the manual measurement.

In accordance with an aspect of the present invention, there is provided a circuit board testing system. The circuit board testing system includes a circuit board testing system. The circuit board testing system includes a computer system and a testing fixture. The testing fixture is connected with a circuit board and the computer system, and acquires a real voltage value of an electronic component of the circuit board. The testing fixture includes a contact element, a switching circuit, a connection module, and a data acquisition unit. The contact element is disposed on the testing fixture and contacted with the electronic component of the circuit board. The switching circuit is connected with the contact element. The connection module is connected with the switching circuit and the circuit board. The circuit board and the computer system are connected with each other through the connection module, so that the computer system is in communication with the circuit board and an electric power is transmitted from the computer system to the circuit board through the connection module. The data acquisition unit is electrically connected with the switching circuit and the computer system, and provides a start voltage to the switching circuit, thereby enabling the connection module and acquiring the real voltage value of the electronic component. The data acquisition unit includes a digital output pin and an analog input pin. The digital output pin is connected with the switching circuit and outputs the start voltage to the switching circuit. The analog input pin is connected with the electronic component and acquires the real voltage value of the electronic component. After the real voltage value is acquired by the analog input pin, the real voltage value is transmitted from the data acquisition unit to the computer system, so that computer system judges whether the circuit board is qualified according to the real voltage value.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

In this context, the electronic components on the circuit board include inductors, capacitors, resistors or any other electronic components with resistances. That is, the electronic components are not restricted to resistors.

Figure 1:
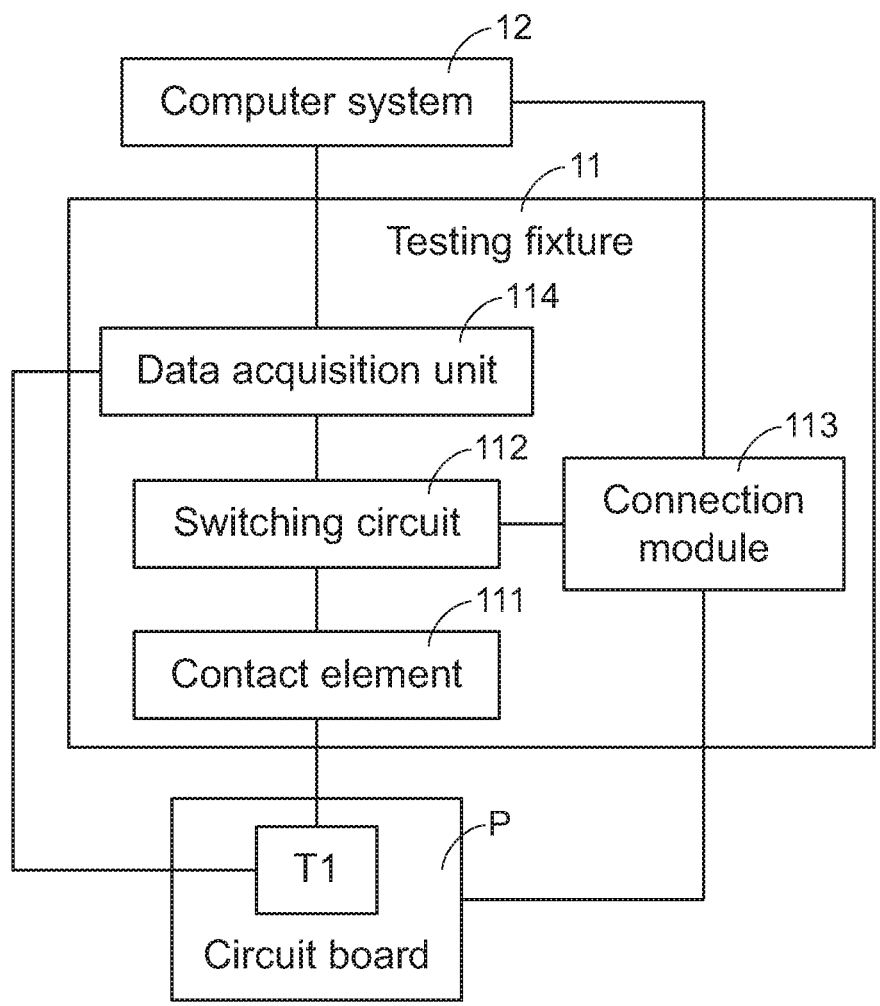
FIG. 1 is a schematic functional block diagram illustrating a circuit board testing system according to a first embodiment of the present invention.

For eliminating the drawbacks of the conventional technologies, the present invention provides a circuit board testing system. FIG. 1 is a schematic functional block diagram illustrating a circuit board testing system according to a first embodiment of the present invention. The circuit board testing system 1 may be applied to a static testing procedure and a dynamic testing procedure of a circuit board. As shown in FIG. 1, the circuit board testing system 1 comprises a testing fixture 11 and a computer system 12. The testing fixture 11 is connected with a circuit board P to be tested. After the circuit board P is tested, a real voltage value of an electronic component T1 of the circuit board P is acquired by the testing fixture 11. The computer system 12 is electrically connected with the testing fixture 11 for judging whether the electronic component T1 is qualified to pass the static test or the dynamic test. Moreover, the testing fixture 11 comprises a contact element 111, a switching circuit 112, a connection module 113, and a data acquisition (DAQ) unit 114. The contact element 111 is disposed on the testing fixture 11, and corresponds to the electronic component T1. The contact element 111 is contacted with the electronic component T1 on the circuit board P. The switching circuit 112 is connected with the contact element 111.

The connection module 113 is connected with the switching circuit 112 and the circuit board P in order for connecting the circuit board P with the computer system 12. Consequently, the computer system 12 is in communication with the circuit board P through the connection module 113, and an electric power is transmitted from the computer system 12 to the circuit board P through the connection module 113. The data acquisition unit 114 is electrically connected with the switching circuit 112 for providing a test voltage Vt (see FIG. 2) and a start voltage Vh (see FIG. 2) to the switching circuit 112 in order to perform a static test on the circuit board P. In this embodiment, the circuit board P is a printed circuit board (PCB), and the contact element 111 is a contact probe.

Figure 2:
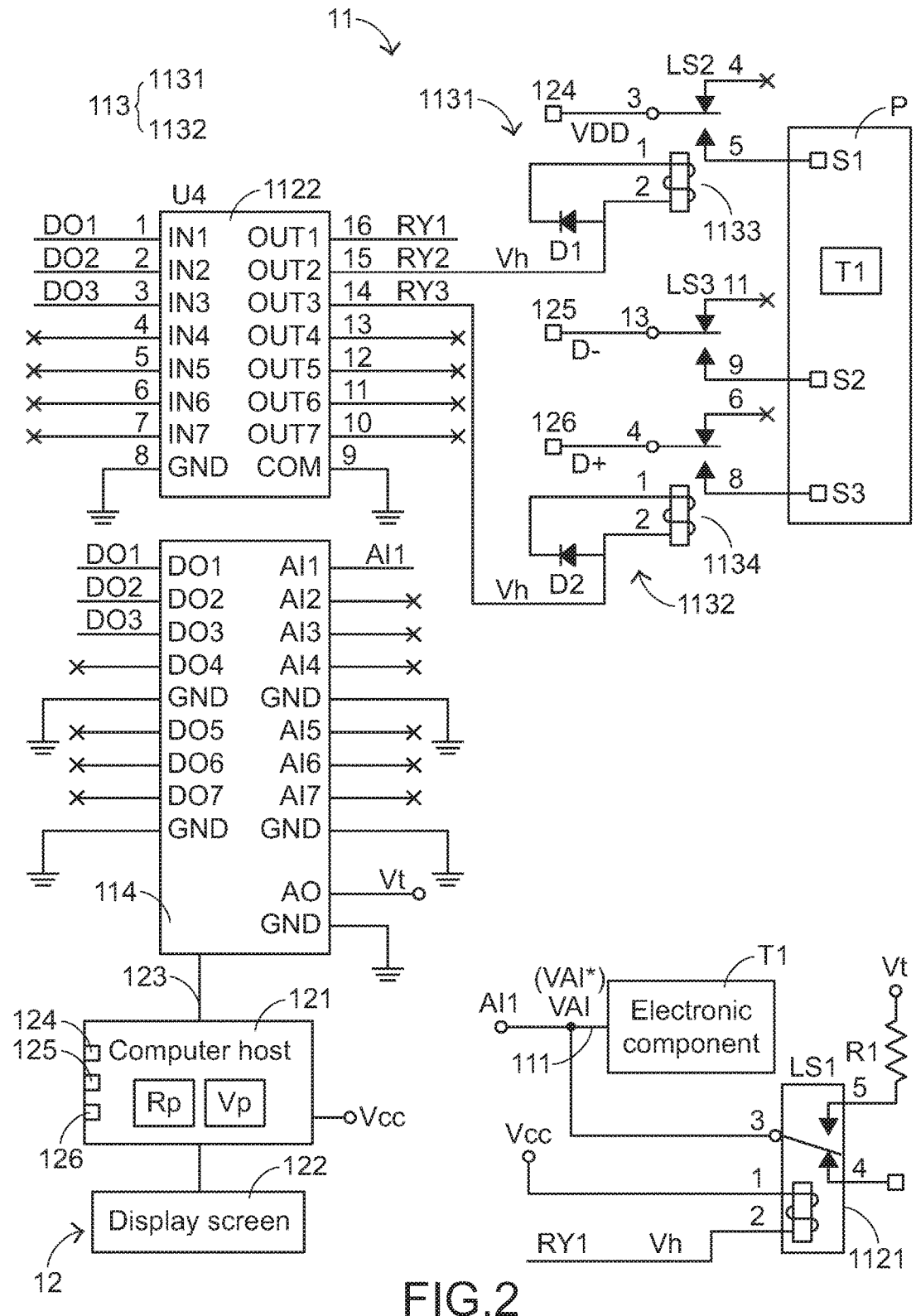
FIG. 2 is a schematic circuit diagram illustrating the circuit board testing system according to the first embodiment of the present invention.

Hereinafter, the circuitry configuration of the circuit board testing system of the present invention will be illustrated with reference to FIGS. 1 and 2. FIG. 2 is a schematic circuit diagram illustrating the circuit board testing system according to the first embodiment of the present invention. In the testing fixture 11, the switching circuit 112 comprises a fixed resistor R1, a first single-pole-single-throw (SPST) relay 1121, and a driving circuit 1122. The fixed resistor R1 corresponds to the electronic component T1. The first SPST relay 1121 comprises a common terminal (i.e. the contact 3 as shown in FIG. 2), a normally open terminal (i.e. the contact 4 as shown in FIG. 2), and a normally closed terminal (i.e. the contact 5 as shown in FIG. 2). The normally closed terminal is connected with the fixed resistor R1. The driving circuit 1122 is connected with the data acquisition unit 114 and the first SPST relay 1121. In response to the operation of the data acquisition unit 114, the first SPST relay 1121 or the connection module 113 is enabled by the driving circuit 1122. The driving circuit 1122 comprises plural input pins IN1~IN3 and plural output pins OUT1~OUT3. In this embodiment, the driving circuit 1122 is a driver IC.

As shown in FIG. 2, the data acquisition unit 114 comprises plural digital output pin DO1~DO3, an analog output pin AO, and an analog input pin AI. The digital output pin DO1 is connected with the input pun IN1 of the driving circuit 1122 for outputting the start voltage Vh to the driving circuit 1122 in order to enable the first SPST relay 1121. The digital output pin DO2~DO3 are connected with the input pins IN2~IN3, respectively. The output pins OUT2~OUT3 corresponding to the input pins IN2~IN3 are connected with the connection module 113 for outputting the start voltage Vh to the connection module 113 in order to enable the connection module 113. The analog output pin AO is connected with the fixed resistor R1 for outputting the test voltage Vt. The analog input pin AI is connected with the electronic component T1 and the common terminal of the first SPST relay 1121 in order for acquiring the real voltage value of the electronic component T1.

The connection module 113 comprises a power supply circuit 1131 and a communication circuit 1132. The power supply circuit 1131 is connected with the driving circuit 1122, the computer system 12 and the circuit board P. When the power supply circuit 1131 is enabled, the electric power is transmitted from the computer system 12 to the circuit board P through the power supply circuit 1131. The power supply circuit 1131 comprises a second SPST relay 1133 and a first diode D1. The second SPST relay 1133 is connected with the driving circuit 1122. A common terminal (i.e. the contact 3 as shown in FIG. 2) of the second SPST relay 1133 is connected with the computer system 12. A normally closed terminal (i.e. the contact 5 as shown in FIG. 2) of the second SPST relay 1133 is connected with a first signal contact S1 of the circuit board P. The first diode D1 is connected with the second SPST relay 1133. By the first diode D1, a first electric current (not shown) flowing in the power supply circuit 1131 is blocked from flowing in a reverse direction. When the second SPST relay 1133 is closed, the power supply circuit 1131 is enabled to transmit the electric power to the circuit board P.

The communication circuit 1132 is connected with the driving circuit 1122, the computer system 12 and the circuit board P. When the communication circuit 1132 is enabled, a computer communication protocol information (not shown) is transmitted from the computer system 12 to the circuit board P through the communication circuit 1132, and a device communication protocol information (not shown) is transmitted from the circuit board P to the computer system 12 through the communication circuit 1132. In this embodiment, the communication circuit 1132 comprises a double-pole-double-throw (DPDT) relay 1134 and a second diode D2. The DPDT relay 1134 is connected with the driving circuit 1122. A first common terminal (i.e. the contact 13 as shown in FIG. 2) of the DPDT relay 1134 is connected with the computer system 12. A second common terminal (i.e. the contact 4 as shown in FIG. 2) of the DPDT relay 1134 is connected with the computer system 12. A first normally closed terminal (i.e. the contact 9 as shown in FIG. 2) of the DPDT relay 1134 is connected with a second signal contact S2 of the circuit board P. A second normally closed terminal (i.e. the contact 8 as shown in FIG. 2) of the DPDT relay 1134 is connected with a third signal contact S3 of the circuit board P. The second diode D2 is connected with the DPDT relay 1134. By the second diode D2, a second electric current (not shown) flowing in the communication circuit 1132 is blocked from flowing in a reverse direction. When the DPDT relay 1134 is closed, the communication circuit 1132 is enabled. Under this circumstance, the computer communication protocol information is transmitted from the computer system 12 to the circuit board P through the communication circuit 1132, and the device communication protocol information is transmitted from the circuit board P to the computer system 12 through the communication circuit 1132.

Please refer to FIG. 1 again. The computer system 12 comprises a computer host 121 and a display screen 122. The computer host 121 is connected with the data acquisition unit 114 and the connection module 113. The computer host 121 is connected with the data acquisition unit 1134 through a USB interface 123. The computer system 12 is connected with the common terminal of the second SPST relay 1133 through a first transmission pin 124. The computer system 12 is connected with the first common terminal of the DPDT relay 1134 through a second transmission pin 125. The computer system 12 is connected with the second common terminal of the DPDT relay 1134 through a third transmission pin 126. In this embodiment, the first transmission pin 124, the second transmission pin 125 and the third transmission pin 126 are collaboratively defined as another USB interface. Moreover, the first transmission pin 124 is a VDD pin, the second transmission pin 125 is a D− pin, and the third transmission pin 126 is a D+ pin.

Moreover, a default resistance range Rp and a default voltage range Vp are previously stored in the computer host 121. According to the default resistance range Rp, the computer host 121 judges whether the circuit board P passes the static test or not. According to the default voltage range Vp, the computer host 121 judges whether the circuit board P passes the dynamic test or not. The display screen 122 is connected with the computer host 121 for displaying the test result of the circuit board P.

Especially, the static testing procedure of the electronic component T1 of the circuit board P is implemented by the switching circuit 112 and the data acquisition unit 114 of the testing fixture 11, and the dynamic testing procedure of the electronic component T1 of the circuit board P is implemented by the connection module 113 and the data acquisition unit 114 of the testing fixture 11. It is noted that the circuit board P has to be tested by the static testing procedure at first. After the circuit board P passes the static test, the dynamic testing procedure can be implemented because the circuit board P has to be powered on during the dynamic testing procedure. Consequently, it is necessary to implement the static testing procedure to assure that the electronic component T1 on the circuit board P is well welded. Under this circumstance, the circuit board P will not be suffered from a short-circuited problem or an open-circuited problem. As known, if the short-circuited problem or the open-circuited problem occurs, the circuit board P is possibly burnt out.

Figure 3:
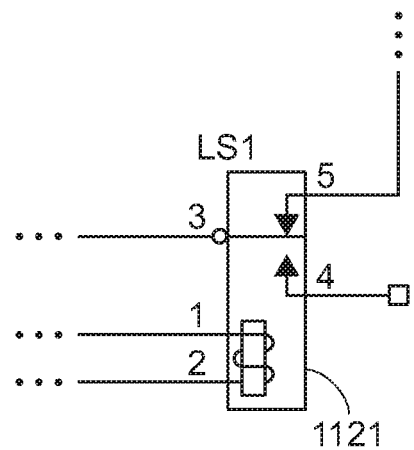
FIG. 3 is a schematic circuit diagram illustrating a close state of the switching circuit of the circuit board testing system according to the first embodiment of the present invention.

A static testing procedure of the circuit board will be simply illustrated as follows. Before the static test of the electronic component T1 on the circuit board P is implemented by the circuit board testing system 1 of the present invention, the circuit board P is placed on the testing fixture 11, and the contact element 111 of the testing fixture 11 is connected with the electronic component T1. The contact element 111 is capable of facilitating fixing the circuit board P on the testing fixture 11. In addition, the electrical connection between the electronic component T1 and the data acquisition unit 114 may be established through the contact element 111. After the circuit board P is properly placed on the testing fixture 11, the data acquisition unit 114 issues the start voltage Vh to the input pin IN1 of the driving circuit 1122 through the digital output pin DO1. Consequently, the output pin OUT1 of the driving circuit 1122 corresponding to the input pin IN1 outputs the start voltage Vh to the first SPST relay 1121. Consequently, the connection between the common terminal and the normally open terminal of the first SPST relay 1121 is changed to the connection between the common terminal and the normally closed terminal of the first SPST relay 1121. That is, the first SPST relay 1121 is in a close state (see FIG. 3). On the other hand, the test voltage Vt is outputted from the data acquisition unit 114 through the analog output pin AO. Under this circumstance, the electronic component T1 and the fixed resistor R1 are collaboratively defined as an equivalent circuit. In this embodiment, the start voltage Vh is a high logic level voltage (e.g. 5V).

Then, the analog input pin AI is connected with the equivalent circuit. According to Ohm's law, the real voltage value VAI corresponding to the electronic component T1 is acquired from the equivalent circuit by the analog input pin AI. Then, the real voltage value VAI of the static test is transmitted from the data acquisition unit 114 to the computer host 121 through the USB interface 123. The real voltage value VAI is a voltage value corresponding to the static test of the electronic component T1.

After the real voltage value VAI of the static test is received by the computer host 121, the real resistance value corresponding to the electronic component T1 is calculated according to a formula, which is previously stored in the computer host 121. The formula is expressed as: the real resistance value corresponding to the electronic component T1=(the real voltage value VAI×the resistance value of the fixed resistor R1)/(the test voltage Vt–the real voltage value VAI). The above formula is obtained according to the equivalent circuit and Ohm's law. Consequently, the real resistance value Rt of the electronic component T1 may be calculated by the computer host 121 according to the above formula. After the real resistance value Rt is obtained by the computer host 121, the computer host 121 judges whether the real resistance value Rt is within the default resistance range Rp or not. If the real resistance value Rt is within the default resistance range Rp, the computer host 121 determines that the electronic component T1 is qualified to pass the static test. Under this circumstance, a pass static test message (not shown) is displayed on the display screen 122 to be viewed by the tester. Whereas, if the real resistance value Rt is not within the default resistance range Rp, the computer host 121 determines that the static test of the electronic component T1 is unqualified. Under this circumstance, a failed static test message (not shown) is displayed on the display screen 122. Consequently, according to the test result shown on the display screen 122, the tester may realize whether the electronic component T1 passes the static test.

After the static test of the electronic component T1 is completed, the dynamic test of the circuit board P is started. Before the dynamic testing procedure is performed, the tester has to connect the computer host 121 with the circuit board P through the connection module 113. That is, the first transmission pin 124 of the computer host 121 is connected with the common terminal of the second SPST relay 1133, the second transmission pin 125 of the computer host 121 is connected with the first common terminal of the DPDT relay 1134, and the third transmission pin 126 of the computer host 121 is connected with the second common terminal of the DPDT relay 1134. On the other hand, the first signal contact S1 of the circuit board P is connected with the normally closed terminal of the second SPST relay 1133, the second signal contact S2 of the circuit board P is connected with the first normally closed terminal of the DPDT relay 1134, and the third signal contact S3 of the circuit board P is connected with the second normally closed terminal of the DPDT relay 1134.

Figure 4:
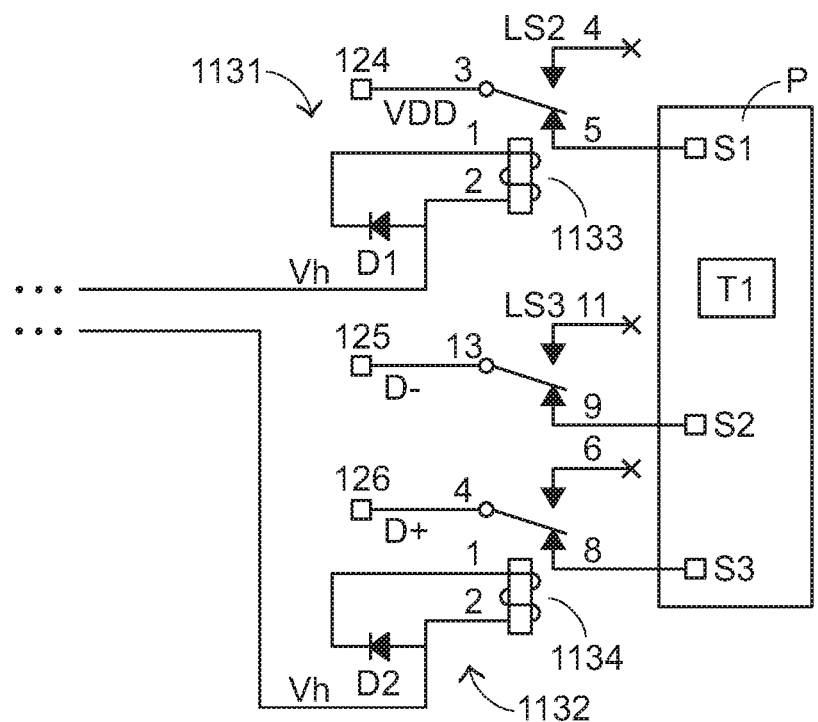
FIG. 4 is a schematic circuit diagram illustrating a close state of the connection module of the circuit board testing system according to the first embodiment of the present invention.

Next, the dynamic test of the circuit board P is performed. Please refer to FIG. 2 again. The data acquisition unit 114 issues the start voltage Vh to the input pins IN2~IN3 of the driving circuit 1122 through the digital output pins DO2~DO3. Consequently, the output pins OUT2~OUT3 of the driving circuit 1122 corresponding to the input pins IN2~IN3 output the start voltage Vh to the power supply circuit 1131 and the communication circuit 1132, respectively. In response to the start voltage Vh from the output pin OUT2, the connection between the common terminal and the normally open terminal of the second SPST relay 1133 of the power supply circuit 1131 is changed to the connection between the common terminal and the normally closed terminal of the second SPST relay 1133. That is, the second SPST relay 1133 is in a close state (see FIG. 4). Meanwhile, since the power supply circuit 1131 is enabled, the electrical connection between the computer host 121 and the circuit board P is established. Consequently, the electric power is transmitted from the computer host 121 to the circuit board P through the power supply circuit 1131.

In response to the start voltage Vh from the output pin OUT3, the connection between the first common terminal and the first normally open terminal of the DPDT relay 1134 of the communication circuit 1132 is changed to the connection between the first common terminal and the first normally closed terminal of the DPDT relay 1134. Moreover, in response to the start voltage Vh from the output pin OUT3, the connection between the second common terminal and the second normally open terminal of the DPDT relay 1134 is changed to the connection between the second common terminal and the second normally closed terminal of the DPDT relay 1134. That is, the DPDT relay 1134 is in a close state (see FIG. 4). Meanwhile, since the communication circuit 1132 is enabled, the communication protocol connection between the computer host 121 and the circuit board P is established. Consequently, the computer communication protocol information is transmitted from the computer host 121 to the circuit board P through the communication circuit 1132, and the device communication protocol information is transmitted from the circuit board P to the computer host 121 through the communication circuit 1132. Under this circumstance, the computer host 121 may identify the circuit board P and obtain associated information of the circuit board P.

After the power supply circuit 1131 and the communication circuit 1132 are enabled, the electric power from the computer host 121 is acquired by the circuit board P. Consequently, the circuit board P is powered on, and the electronic component T1 on the circuit board P is also powered on. Meanwhile, the real voltage value VAI* corresponding to the electronic component T1 is acquired by the analog input pin AI of the data acquisition unit 114, which is connected with the electronic component T1. Then, the real voltage value VAI* is transmitted from the data acquisition unit 114 to the computer host 121 through the USB interface 123. The real voltage value VAI* is a voltage value corresponding to the dynamic test of the electronic component T1.

After the real voltage value VAI* corresponding to the dynamic test is obtained by the computer host 121, the computer host 121 judges whether the real voltage value VAI* is within the default voltage range Vp, thereby determining whether the electronic component T1 passes the dynamic test. If the real voltage value VAI* is within the default voltage range Vp, the computer host 121 determines that the electronic component T1 is qualified to pass the dynamic test. Under this circumstance, a pass dynamic test message (not shown) is displayed on the display screen 122 to be viewed by the tester. Whereas, if the real voltage value VAI* is not within the default voltage range Vp, the computer host 121 determines that the dynamic test of the electronic component T1 is unqualified. Under this circumstance, a failed dynamic test message (not shown) is displayed on the display screen 122. Consequently, according to the dynamic test result shown on the display screen 122, the tester may realize whether the electronic component T1 passes the dynamic test.

It is noted that the action of connecting the computer host 121 with the circuit board P in the dynamic testing procedure is not limited to be performed after the static testing procedure. That is, the action of connecting the computer host 121 with the circuit board P in the dynamic testing procedure may be performed before the static testing procedure. In case that the start voltage Vh which is outputted from the digital output pin DO1 of the data acquisition unit 114 is transmitted to the driving circuit 1122, the static test of the circuit board P may be performed. Whereas, in case that the start voltage Vh which is outputted from the digital output pins DO2~DO3 of the data acquisition unit 114 enable the connection mode 113, the dynamic test of the circuit board P may be performed. In other words, when the circuit board testing system 1 of the present invention performs the static testing procedure, the digital output pin DO1 of the data acquisition unit 114 is enabled, but the digital output pins DO2~DO3 of the data acquisition unit 114 are disabled. Whereas, when the circuit board testing system 1 of the present invention performs the dynamic testing procedure, the digital output pins DO2~DO3 of the data acquisition unit 114 are enabled, but the digital output pin DO1 of the data acquisition unit 114 is disabled.

From the above discussions, the above circuitry configuration of the circuit board testing system of the present invention is used to simulate the process of manually performing the static testing procedure and the dynamic testing procedure by the tester. That is, the static testing procedure can judge whether the electronic component is successfully placed on the circuit board, and the dynamic testing procedure can judge whether the electronic component is normally operated (i.e. a function testing procedure). For facilitating understanding the spirits of the circuit board testing system, only one electronic component T1 is mounted on the circuit board P in this embodiment. It is noted that the circuit board testing system of the present invention is not limited to test a circuit board with a single electronic component. Hereinafter, another circuit board testing system for testing a circuit board with plural electronic components will be illustrated.

Figure 5:
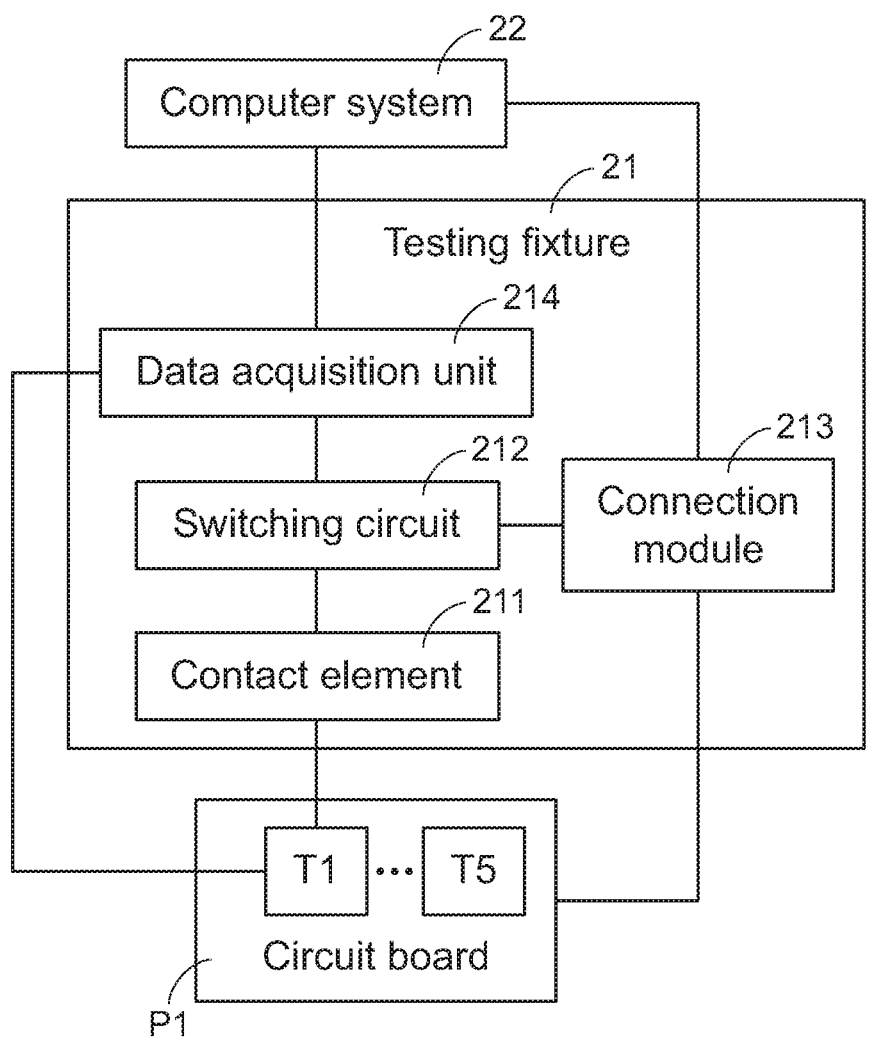
FIG. 5 is a schematic functional block diagram illustrating a circuit board testing system according to a second embodiment of the present invention.
Figure 6:
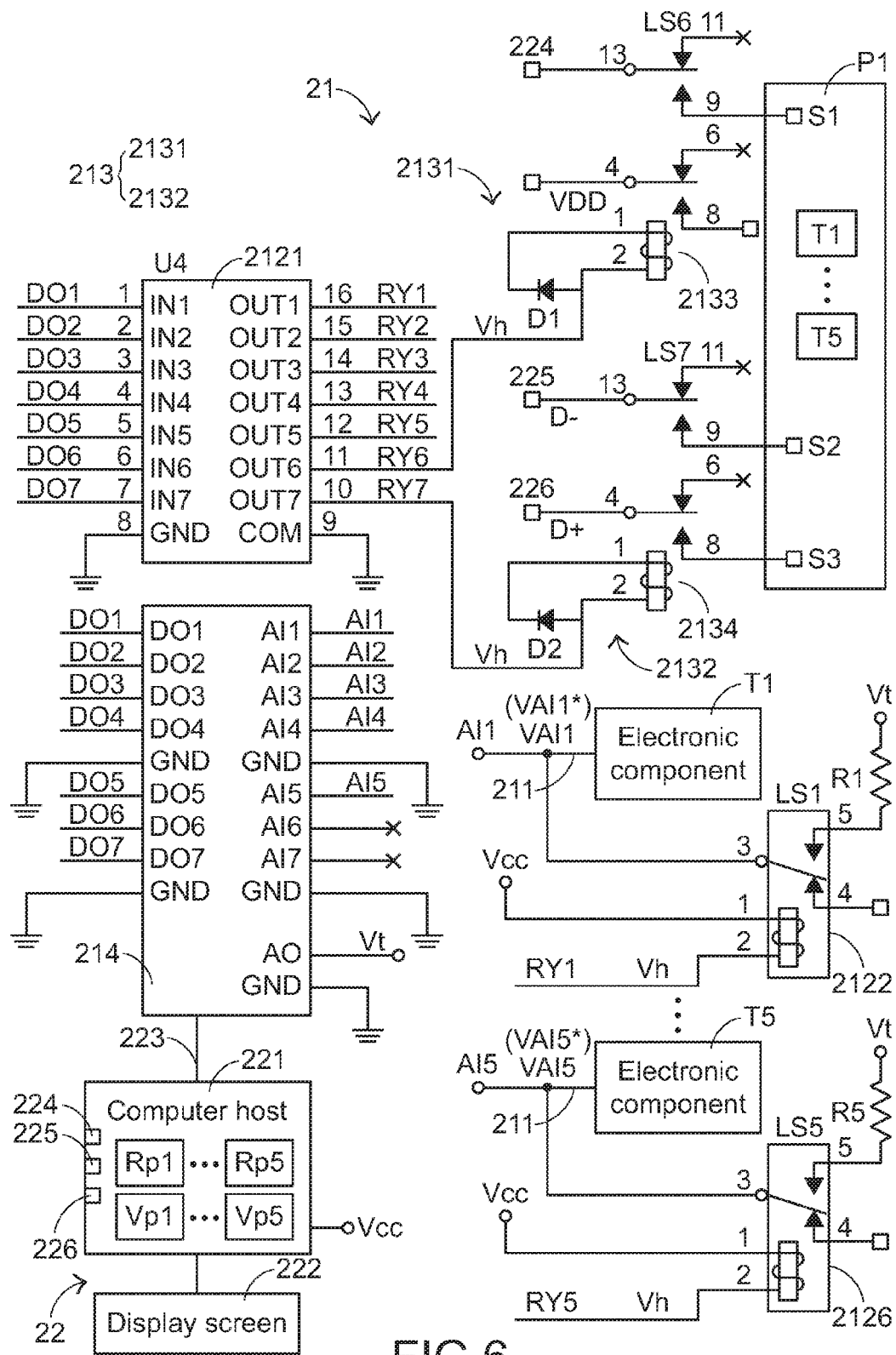
FIG. 6 is a schematic circuit diagram illustrating a circuit board testing system according to the second embodiment of the present invention.

The present invention further provides a second embodiment. FIG. 5 is a schematic functional block diagram illustrating a circuit board testing system according to a second embodiment of the present invention. FIG. 6 is a schematic circuit diagram illustrating a circuit board testing system according to the second embodiment of the present invention. Please refer to FIGS. 5 and 6. The circuit board testing system 2 may be applied to a static testing procedure and a dynamic testing procedure of a circuit board P1 with plural electronic components T1~T5. The circuit board testing system 2 comprises a testing fixture 21 and a computer system 22. The computer system 22 comprises a computer host 221 and a display screen 222. The computer host 221 is connected with the testing fixture 21 through a USB interface 223. Moreover, plural default resistance ranges Rp1~Rp5 and plural default voltage ranges Vp1~Vp5 are previously stored in the computer host 221. The functions and operations of the computer system 22 of this embodiment are identical to those of the computer system 12 of the first embodiment, and are not redundantly described herein. In comparison with the first embodiment, the structure of the testing fixture 21 of this embodiment is distinguished. The components of the testing fixture 21 of this embodiment are substantially identical to those of the testing fixture 11 of the first embodiment, but the connecting relationships between these components are modified. The components of the testing fixture 21 will be illustrated in more details as follows.

Please refer to FIGS. 5 and 6 again. The testing fixture 21 comprises plural contact elements 211, a switching circuit 212, a connection module 213, and a data acquisition unit 214. The plural contact elements 211 are disposed on the testing fixture 21, and correspond to the plural electronic components T1~T5. The plural contact elements 211 are respectively contacted with the plural electronic components T1~T5 on the circuit board P1. Each of the plural contact elements 211 corresponds to one electronic component. That is, the testing fixture 21 of this embodiment comprises 5 contact elements 211. The switching circuit 212 is connected with the plural contact elements 211. The switching circuit 212 comprises plural fixed resistors R1~R5, a driving circuit 2121, and plural single-pole-single-throw (SPST) relays 2122~2126. The plural fixed resistors R1~R5 and the plural SPST relays 2122~2126 correspond to the plural electronic components T1~T5, respectively. The operations of the plural fixed resistors R1~R5 are identical to those of the fixed resistor R1 of the first embodiment, and the operations of the SPST relays 2122~2126 are identical to those of the SPST relay 1121 of the first embodiment. The driving circuit 2121 is connected with the data acquisition unit 214 and the plural SPST relays 2122~2126. In response to the operation of the data acquisition unit 214, one or more of the plural SPST relays 2122~2126 are selectively enabled by the driving circuit 2121. The driving circuit 2121 comprises plural input pins IN1~IN7 and plural output pins OUT1~OUT7. In response to the operation of the data acquisition unit 214, one of the plural SPST relays 2122~2126 is selectively enabled at each time. In this embodiment, the driving circuit 2121 is a driver IC.

As shown in FIG. 6, the data acquisition unit 214 comprises plural digital output pins DO1~DO7, an analog output pin AO, and plural analog input pins AI1~AI5. The plural digital output pins DO1~DO7 correspond to the plural input pins IN1~IN7 of the driving circuit 2121, respectively. Moreover, the plural digital output pins DO1~DO7 are connected with the plural input pins IN1~IN7, respectively. The plural analog input pins AI1~AI5 correspond to the plural electronic components T1~T5 and the plural SPST relays 2122~2126, respectively. In addition, the plural analog input pins AI1~AI5 are connected with the plural electronic components T1~T5 and the plural SPST relays 2122~2126, respectively. The analog output pin AO is connected with the plural fixed resistors R1~R5. It is noted that the resistance values of the plural fixed resistors R1~R5 may be different or identical. According to the practical requirements, all of the resistance values of the plural fixed resistors R1~R5 are different. Alternatively, in some other embodiments, all of the resistance values of the plural fixed resistors R1~R5 are identical.

As shown in FIGS. 5 and 6, the connection module 213 comprises a power supply circuit 2131 and a communication circuit 2132. The power supply circuit 2131 is connected with the output pin OUT6 of the driving circuit 2122, the computer host 221 and the circuit board P1. When the power supply circuit 2131 is enabled, an electric power is transmitted from the computer host 221 to the circuit board P1. The power supply circuit 2131 comprises a first double-pole-double-throw (DPDT) relay 2133 and a first diode D1. The first DPDT relay 2133 is connected with the driving circuit 2121. A first common terminal (i.e. the contact 13 as shown in FIG. 6) of the first DPDT relay 2133 is connected with a first transmission pin 224 of the computer host 221. A first normally closed terminal (i.e. the contact 9 as shown in FIG. 6) of the first DPDT relay 2133 is connected with a first signal contact S1 of the circuit board P1. The first diode D1 is connected with the first DPDT relay 2133. By the first diode D1, a first electric current (not shown) flowing in the power supply circuit 2131 is blocked from flowing in a reverse direction. When the first DPDT relay 2133 is closed, the power supply circuit 2131 is enabled. Consequently, the electric power is transmitted from the computer host 221 to the circuit board P1 through the power supply circuit 2131.

Please refer to FIG. 6 again. The communication circuit 2132 is connected with the output terminal OUT7 of the driving circuit 2121, the computer system 22 and the circuit board P1. When the communication circuit 2132 is enabled, a computer communication protocol information (not shown) is transmitted from the computer host 221 to the circuit board P1 through the communication circuit 2132, and a device communication protocol information (not shown) is transmitted from the circuit board P1 to the computer host 221 through the communication circuit 2132. In this embodiment, the communication circuit 2132 comprises a second double-pole-double-throw (DPDT) relay 2134 and a second diode D2. The second DPDT relay 2134 is connected with the driving circuit 2121. A first common terminal (i.e. the contact 13 as shown in FIG. 6) of the second DPDT relay 2134 is connected with a second transmission pin 225 of the computer host 221. A second common terminal (i.e. the contact 4 as shown in FIG. 6) of the second DPDT relay 2134 is connected with a third transmission pin 226 of the computer host 221. A first normally closed terminal (i.e. the contact 9 as shown in FIG. 6) of the second DPDT relay 2134 is connected with a second signal contact S2 of the circuit board P1. A second normally closed terminal (i.e. the contact 8 as shown in FIG. 6) of the second DPDT relay 2134 is connected with a third signal contact S3 of the circuit board P1. The second diode D2 is connected with the second DPDT relay 2134. By the second diode D2, a second electric current (not shown) flowing in the communication circuit 2132 is blocked from flowing in a reverse direction. When the second DPDT relay 2134 is closed, the communication circuit 2132 is enabled. Under this circumstance, the computer communication protocol information is transmitted from the computer host 221 to the circuit board P1 through the communication circuit 2132, and the device communication protocol information is transmitted from the circuit board P1 to the computer host 221 through the communication circuit 2132.

The operations of the static testing procedure and the dynamic testing procedure implemented by the circuit board testing system 2 of this embodiment are substantially identical to those of the circuit board testing system 1. In comparison with the circuit board testing system 1, the number of electronic components to be tested by the circuit board testing system 2 of this embodiment is increased to 5. After the real voltage values VAI1~VAI5 and VAI1*~VAI5* are acquired by the analog input pin AI1~AI5 of the data acquisition unit 214, the static testing procedure and the dynamic testing procedure are performed to test the electronic components T1~T5 according to the default resistance ranges Rp1~Rp5 and the default voltage ranges Vp1~Vp5, which are previously stored in the computer host 221. The real voltage values VAI1~VAI5 are the voltage values corresponding to the static tests of the electronic components T1~T5. The real voltage values VAI1*~VAI5* are the voltage values corresponding to the dynamic tests of the electronic components T1~T5.

It is noted that numerous modifications and alterations may be made while retaining the teachings of the invention. For example, in order to increase the number of tested electronic components, the plural SPST relays of the switching circuit may be replaced by plural DPDT relays. As mentioned above, the analog output pin AO of the data acquisition unit 214 is connected with the plural fixed resistors R1~R5. In the above embodiment, the circuit board testing system 2 may perform a static test of one electronic component at a time. That is, the test voltage Vt provided by the analog output pin AO at each time is sufficient to allow the electronic component and the corresponding fixed resistor to form the equivalent circuit. Consequently, the static testing procedure can be performed. Alternatively, in some other embodiments, the circuit board testing system may perform the static test of two or three electronic components at a time. That is, the test voltage provided by the analog output pin at each time is sufficient to allow the two or three electronic components and the corresponding fixed resistors to form the equivalent circuits. That is, in response to the operation of the data acquisition unit, the plural SPST relays or the plural DPDT relays of the switching circuit may be selectively enabled by the driving circuit at each time. Consequently, the circuit board testing system is not restricted to test one electronic component at each time. For enhancing the testing efficiency, the circuit board testing system is capable of testing plural electronic components at each time.

Figure 7:
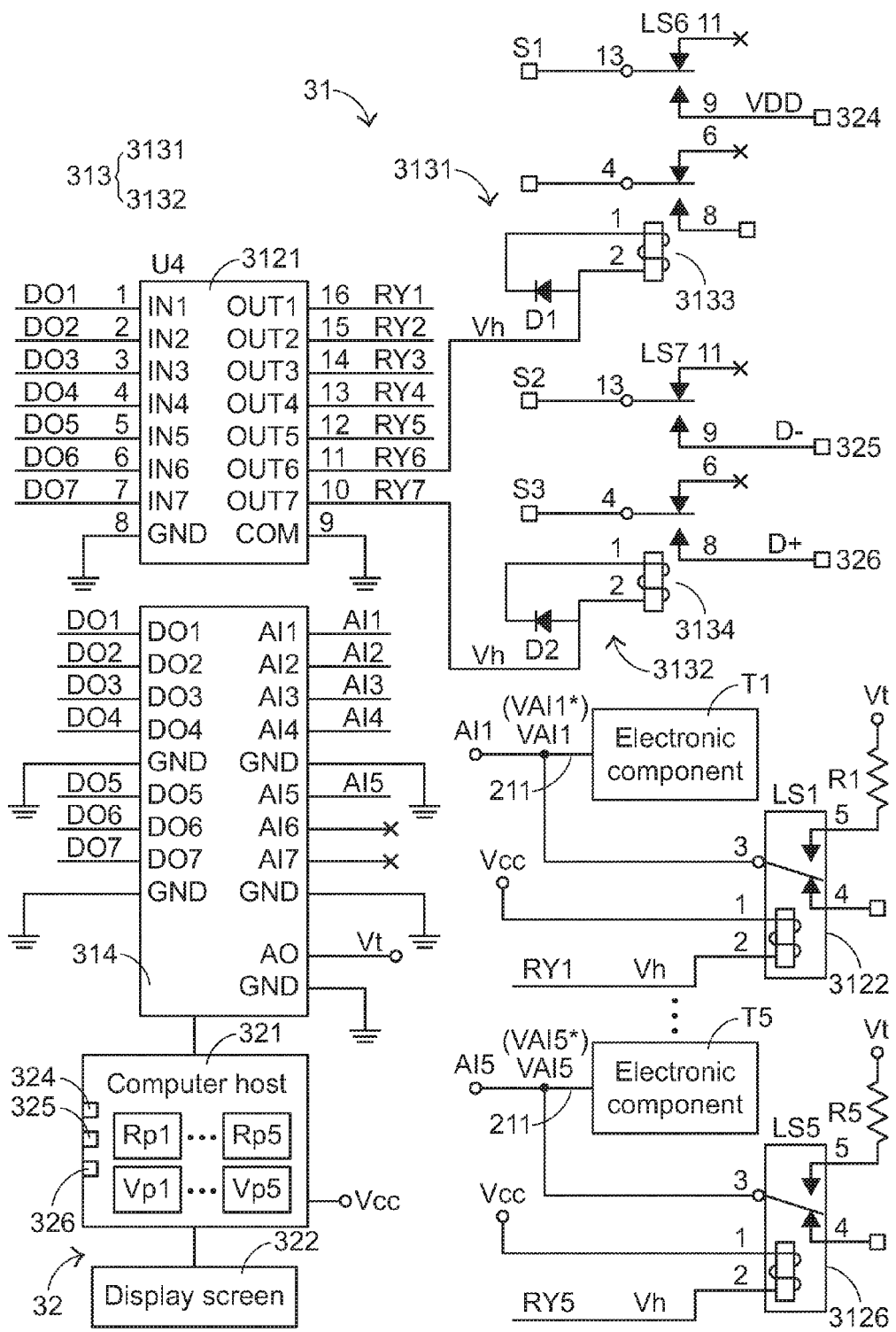
FIG. 7 is a schematic circuit diagram illustrating a circuit board testing system according to a third embodiment of the present invention.

The present invention further provides a third embodiment. FIG. 7 is a schematic circuit diagram illustrating a circuit board testing system according to a third embodiment of the present invention. The circuit board testing system 3 comprises a testing fixture 31 and a computer system 32. The computer system 32 comprises a computer host 321 and a display screen 322. The testing fixture 31 comprises plural contact elements 311, a switching circuit (not shown), a connection module 313, and a data acquisition unit 314. The switching circuit is connected with the plural contact elements 311. The switching circuit comprises plural fixed resistors R1~R5, a driving circuit 3121, and plural single-pole-single-throw (SPST) relays 3122~3126. The structures and operations of the circuit board testing system 3 of this embodiment are identical to those of the circuit board testing system 2 of the second embodiment, and are not redundantly described herein. In comparison with the circuit board testing system 2 of the second embodiment, the connecting relationships between the connection module 313 and the computer system and the circuit board (not shown) of the circuit board testing system 3 of this embodiment are distinguished. The connecting relationships between the connection module 313 and the computer system and the circuit board will be illustrated in more details as follows.

As shown in FIG. 7, the connection module 313 comprises a power supply circuit 3131 and a communication circuit 3132. The power supply circuit 3131 is connected with a driving circuit 3121 of the switching circuit, the computer system and the circuit board. The power supply circuit 3131 comprises a first double-pole-double-throw (DPDT) relay 3133 and a first diode D1. The functions and operations of the first DPDT relay 3133 and the first diode D1 are similar to those of the second embodiment. In comparison with the second embodiment, the first DPDT relay 3133 is connected with the output pin OUT6 of the driving circuit 3121, a first common terminal (i.e. the contact 13 as shown in FIG. 7) of the first DPDT relay 3133 is connected with a first signal contact S1 of the circuit board, and a first normally closed terminal (i.e. the contact 9 as shown in FIG. 7) of the first DPDT relay 3133 is connected with a first transmission pin 324 of the computer system. That is, the way of connecting the first DPDT relay 3133 with the computer system and the circuit board is opposed to the way of connecting the first DPDT relay 2133 with the computer system and the circuit board, but the operations of the dynamic testing procedure are not adversely affected.

The communication circuit 3132 is connected with the driving circuit 3121, the computer system and the circuit board. In this embodiment, the communication circuit 3132 comprises a second double-pole-double-throw (DPDT) relay 3134 and a second diode D2. The functions and operations of the second DPDT relay 3134 and the second diode D2 are similar to those of the second embodiment. In comparison with the second embodiment, the second DPDT relay 3134 is connected with the output pin OUT7 of the driving circuit 3121, a first common terminal (i.e. the contact 13 as shown in FIG. 7) of the second DPDT relay 3134 is connected with a second signal contact S2 of the circuit board, and a second common terminal (i.e. the contact 4 as shown in FIG. 7) of the second DPDT relay 3134 is connected with a third signal contact S3 of the circuit board. A first normally closed terminal (i.e. the contact 9 as shown in FIG. 7) of the second DPDT relay 3134 is connected with a second transmission pin 325 of the computer system. A second normally closed terminal (i.e. the contact 8 as shown in FIG. 7) of the second DPDT relay 3134 is connected with a third transmission pin 326 of the computer system. That is, the way of connecting the second DPDT relay 3134 with the computer system and the circuit board is opposed to the way of connecting the second DPDT relay 2134 with the computer system and the circuit board, but the operations of the dynamic testing procedure are not adversely affected.

The operations of the static testing procedure and the dynamic testing procedure implemented by the circuit board testing system 3 of this embodiment are substantially identical to those of the circuit board testing system 2 of the second embodiment, and are not redundantly described herein.

It is noted that the way of connecting the connection module 113 with the computer host 121 and the circuit board P in the circuit board testing system 1 of the first embodiment may be replaced by the way of third embodiment. That is, in the power supply circuit 1131, the common terminal of the second SPST relay 1133 is connected with the first signal contact S1 of the circuit board P, and the normally closed terminal of the second SPST relay 1133 is connected with the first transmission pin 124 of the computer host 121. Moreover, in the communication circuit 1132, the first common terminal of the DPDT relay 1134 is connected with the second signal contact S2 of the circuit board P, the second common terminal of the DPDT relay 1134 is connected with the third signal contact S3 of the circuit board P, the first normally closed terminal of the DPDT relay 1134 is connected with the second transmission pin 125 of the computer host 121, and the second normally closed terminal of the DPDT relay 1134 is connected with the third transmission pin 126 of the computer host 121. The operations of the dynamic testing procedure of the circuit board testing system 1 are not adversely affected by above connecting ways.

Figure 8:
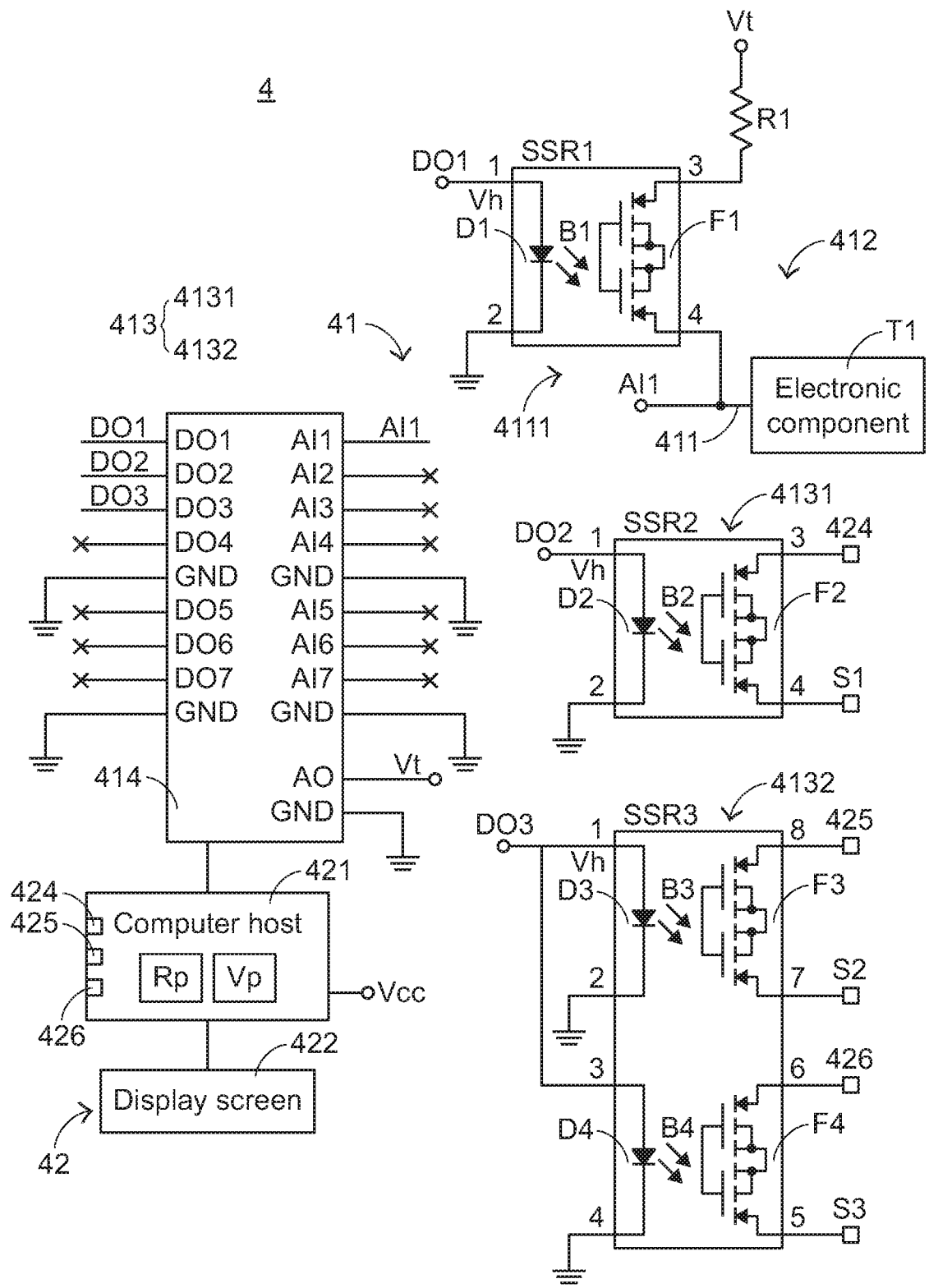
FIG. 8 is a schematic circuit diagram illustrating a circuit board testing system according to a fourth embodiment of the present invention.

The present invention further provides a fourth embodiment. FIG. 8 is a schematic circuit diagram illustrating a circuit board testing system according to a fourth embodiment of the present invention. The circuit board testing system 4 comprises a testing fixture 41 and a computer system 42. The computer system 42 comprises a computer host 421 and a display screen 422. The testing fixture 41 comprises a contact element 411, a switching circuit 412, a connection module 413, and a data acquisition unit 414. The structures and operations of the circuit board testing system 4 of this embodiment are identical to those of the circuit board testing system 1 of the first embodiment, and are not redundantly described herein. In comparison with the circuit board testing system 1 of the first embodiment, the circuitry configurations of the switching circuit 412 and the connection module 413 are distinguished. The circuitry configurations of the switching circuit 412 and the connection module 413 will be illustrated in more details as follows.

As shown in FIG. 8, the switching circuit 412 is connected with the contact element 411. The switching circuit 412 comprises a fixed resistor R1 and an optical relay 4111. In response to the start voltage Vh, the electronic component T1 and the fixed resistor R1 are collaboratively defined as an equivalent circuit. In this embodiment, the optical relay 4111 comprises a first light emitter D1 and a first metal-oxide-semiconductor field-effect transistor F1. A first input terminal of the first light emitter D1 (i.e. the contact 1 as shown in FIG. 8) is connected with a digital output pin DO1 of the data acquisition unit 414. A second input terminal of the first light emitter D1 (i.e. the contact 2 as shown in FIG. 8) is connected with a ground terminal. In response to the start voltage Vh, the first light emitter D1 emits a first light beam B1. A first output terminal of the first metal-oxide-semiconductor field-effect transistor F1 (i.e. the contact 3 as shown in FIG. 8) is connected with the fixed resistor R1. Moreover, a second output terminal of the first metal-oxide-semiconductor field-effect transistor F1 (i.e. the contact 4 as shown in FIG. 8) is connected with an analog input pin AI1 of the data acquisition unit 414 and the electronic component T1. When the first light beam B1 is received by the first metal-oxide-semiconductor field-effect transistor F1, the first metal-oxide-semiconductor field-effect transistor F1 is closed, and thus the optical relay 4111 is enabled. In this embodiment, the optical relay 4111 is a single-pole-single-throw (SPST) normally-open optical relay.

After the optical relay 4111 is enabled, the real voltage value (not shown) of the static test is acquired by the analog input pin AI1 of the data acquisition unit 414. Then, the static testing procedure of the circuit board testing system 4 is continuously performed. The static testing procedure of the circuit board testing system 4 of this embodiment is similar to that of the first embodiment, and is not redundantly described herein.

As shown in FIG. 8, the connection module 413 comprises a power supply circuit 4131 and a communication circuit 4132. The power supply circuit 4131 is connected with a digital output pin DO2 of the data acquisition unit 414, the computer host 421 and the circuit board (not shown). The power supply circuit 4131 comprises a second light emitter D2 and a second metal-oxide-semiconductor field-effect transistor F2. A third input terminal of the second light emitter D2 (i.e. the contact 1 as shown in FIG. 8) is connected with a digital output pin DO2 of the data acquisition unit 414. A fourth input terminal of the second light emitter D2 (i.e. the contact 2 as shown in FIG. 8) is connected with the ground terminal. In response to the start voltage Vh, the second light emitter D2 emits a second light beam B2. A third output terminal of the second metal-oxide-semiconductor field-effect transistor F2 (i.e. the contact 3 as shown in FIG. 8) is connected with a first transmission pin 424 of the computer host 421. Moreover, a fourth output terminal of the second metal-oxide-semiconductor field-effect transistor F2 (i.e. the contact 4 as shown in FIG. 8) is connected with a first signal contact S1 of the circuit board. When the second light beam B2 is received by the second metal-oxide-semiconductor field-effect transistor F2, the second metal-oxide-semiconductor field-effect transistor F2 is closed, and thus the power supply circuit 4131 is enabled. When the second metal-oxide-semiconductor field-effect transistor F2 is closed and the power supply circuit 4131 is enabled, an electric power is transmitted from the computer host 421 to the circuit board. In this embodiment, the power supply circuit 4131 is a single-pole-single-throw (SPST) normally-open optical relay.

The communication circuit 4132 is connected with a digital output pin DO3 of the data acquisition unit 414, the computer host 421 and the circuit board (not shown). The communication circuit 4132 comprises a third light emitter D3, a third metal-oxide-semiconductor field-effect transistor F3, a fourth light emitter D4 and a fourth metal-oxide-semiconductor field-effect transistor F4. A fifth input terminal of the third light emitter D3 (i.e. the contact 1 as shown in FIG. 8) is connected with a digital output pin DO3 of the data acquisition unit 414. A sixth input terminal of the third light emitter D3 (i.e. the contact 2 as shown in FIG. 8) is connected with the ground terminal. In response to the start voltage Vh, the third light emitter D3 emits a third light beam B3. A fifth output terminal of the third metal-oxide-semiconductor field-effect transistor F3 (i.e. the contact 8 as shown in FIG. 8) is connected with a second transmission pin 425 of the computer host 421. Moreover, a sixth output terminal of the third metal-oxide-semiconductor field-effect transistor F3 (i.e. the contact 7 as shown in FIG. 8) is connected with a second signal contact S2 of the circuit board. When the third light beam B3 is received by the third metal-oxide-semiconductor field-effect transistor F3, the third metal-oxide-semiconductor field-effect transistor F3 is closed.

A seventh input terminal of the fourth light emitter D4 (i.e. the contact 3 as shown in FIG. 8) is connected with the digital output pin DO3 of the data acquisition unit 414. An eighth input terminal of the fourth light emitter D4 (i.e. the contact 4 as shown in FIG. 8) is connected with the ground terminal. In response to the start voltage Vh, the fourth light emitter D4 emits a fourth light beam B4. A seventh output terminal of the fourth metal-oxide-semiconductor field-effect transistor F4 (i.e. the contact 6 as shown in FIG. 8) is connected with a third transmission pin 426 of the computer host 421. Moreover, an eighth output terminal of the fourth metal-oxide-semiconductor field-effect transistor F4 (i.e. the contact 5 as shown in FIG. 8) is connected with a third signal contact S3 of the circuit board. When the fourth light beam B4 is received by the fourth metal-oxide-semiconductor field-effect transistor F4, the fourth metal-oxide-semiconductor field-effect transistor F4 is closed. When both of the third metal-oxide-semiconductor field-effect transistor F3 and the fourth metal-oxide-semiconductor field-effect transistor F4 are closed, the communication circuit 4132 is enabled. Under this circumstance, a computer communication protocol information (not shown) is transmitted from the computer host 421 to the circuit board through the communication circuit 4132, and a device communication protocol information is transmitted from the circuit board to the computer host 421 through the communication circuit 4132. In this embodiment, the communication circuit 4132 is a double-pole-double-throw (DPDT) normally-open optical relay. The dynamic testing procedure of the circuit board testing system 4 of this embodiment is similar to that of the first embodiment, and is not redundantly described herein.

In the circuit board testing system 4 of this embodiment, the optical relay 4111 of the switching circuit 412 is used to replace the conventional single-pole-single-throw (SPST) relay, and the double-pole-double-throw (DPDT) normally-open optical relay of the communication circuit 4132 is used to replace the conventional single-pole-single-throw (SPST) relay and the conventional double-pole-double-throw (DPDT) relay. In comparison with the conventional SPST relay and the conventional DPDT relay, the above two optical relays can reduce the loss current and largely reduce the excitation loss. Moreover, since a low voltage is sufficient to drive the light emitter of the optical relay, it is not necessary to install the switching circuit. Consequently, the cost of the components will be reduced.

In the above embodiments, the numbers of pins of the data acquisition unit and the driving circuit of the circuit board testing system of the present invention are limited. For expanding the numbers of pins of the data acquisition unit and the driving circuit, the data acquisition unit and the driving circuit may be additionally equipped with multiplexers. Consequently, the data acquisition unit and the driving circuit may be connected to more SPST relays or more DPDT relays in order to test more electronic components. Since the tester can test more electronic components in a test cycle of a circuit board, the efficiency of the static test is enhanced.

From the above descriptions, the present invention provides a circuit board testing system. In the circuit board testing system, a data acquisition unit and a switching circuit are disposed on a testing fixture. Consequently, the electronic component to be tested and the corresponding fixed resistor are collaboratively defined as an equivalent circuit, and a real voltage value corresponding to the electronic component of the static test is acquired from the equivalent circuit. Then, a real resistance value corresponding to the electronic component is calculated by the computer system according to the real voltage value and the above formula. Then, the computer system judges whether the real resistance value is within a default resistance range, thereby determining whether the electronic component passes the static test.

Moreover, in the circuit board testing system of the present invention, the data acquisition unit and the connection module are collaboratively defined as a simulation circuit, which is connected with the circuit board and the computer system. Consequently, by acquiring the electric power from the computer system, the circuit board is powered on. Under this circumstance, the real voltage value corresponding to the electronic component of the dynamic test is acquired by the data acquisition unit. Then, the computer system judges whether the real resistance value is within the default resistance range, thereby judging whether the electronic component passes the dynamic test. In comparison with the conventional manual testing method of repeatedly using a contact probe of an electricity meter to manually and sequentially contact each electronic component to be tested, the circuit board testing system of the present invention can save labor and time and achieve better testing efficiency.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A circuit board testing system, comprising:
   a computer system; and
   a testing fixture connected with a circuit board and the computer system, and acquiring a real voltage value of an electronic component of the circuit board, wherein the testing fixture comprises:
   a contact element disposed on the testing fixture and contacted with the electronic component of the circuit board;
   a switching circuit connected with the contact element;
   a connection module connected with the connected with the switching circuit and the circuit board, wherein the circuit board and the computer system are connected with each other through the connection module, so that the computer system is in communication with the circuit board and an electric power is transmitted from the computer system to the circuit board through the connection module; and a data acquisition unit electrically connected with the switching circuit and the computer system, and providing a start voltage to the switching circuit, thereby enabling the connection module and acquiring the real voltage value of the electronic component, wherein the data acquisition unit comprises a digital output pin and an analog input pin, wherein the digital output pin is connected with the switching circuit and outputs the start voltage to the switching circuit, wherein the analog input pin is connected with the electronic component and acquires the real voltage value of the electronic component, wherein after the real voltage value is acquired by the analog input pin, the real voltage value is transmitted from the data acquisition unit to the computer system, so that computer system judges whether the circuit board is qualified according to the real voltage value, wherein the connection module comprises:

a power supply circuit connected with the switching circuit, the computer system and the circuit board, wherein when the power supply circuit is enabled, the electric power is transmitted from the computer system to the circuit board through the power supply circuit; and a communication circuit connected with a driving circuit, the computer system and the circuit board, wherein when the communication circuit is enabled, a computer communication protocol information of the computer system is transmitted to the circuit board through the communication circuit, and a device communication protocol information of the circuit board is transmitted to the computer system through the communication circuit; and wherein the power supply circuit comprises:

a first light emitter, wherein a first input terminal of the first light emitter is connected with the data acquisition unit, a second input terminal of the first light emitter is connected with a ground terminal, and the first light emitter emits a first light beam in response to the start voltage;

a first metal-oxide-semiconductor field-effect transistor, wherein a first output terminal of the first metal-oxide-semiconductor field-effect transistor is connected with a first transmission pin of the computer host, and a second output terminal of the first metal-oxide-semiconductor field-effect transistor is connected with a first signal contact of the circuit board, wherein when the first light beam is received by the first metal-oxide-semiconductor field-effect transistor, the first metal-oxide-semiconductor field-effect transistor is closed, so that the power supply circuit is enabled;

wherein the communication circuit comprises:

a second light emitter, wherein a third input terminal of the second light emitter is connected with the data acquisition unit, a fourth input terminal of the second light emitter is connected with the ground terminal, arid the second light emitter emits a second light beam in response to the start voltage;

a second metal-oxide-semiconductor field-effect transistor, wherein a third output terminal of the second metal-oxide-semiconductor field-effect transistor is connected with a second transmission pin of the computer host, and a fourth output terminal of the second metal-oxide-semiconductor field-effect transistor is connected with a second signal contact of the circuit board, wherein when the second light beam is received by the second metal-oxide-semiconductor field-effect transistor, the second metal-oxide-semiconductor field-effect transistor is closed;

a third light emitter, wherein a fifth input terminal of the third light emitter is connected with the data acquisition unit, a sixth input terminal of the third light emitter is connected with the ground terminal, and the third light emitter emits a third light beam in response to the start voltage; and a third metal-oxide-semiconductor field-effect transistor, wherein a fifth output terminal of the third metal-oxide-semiconductor field-effect transistor is connected with a third transmission pin of the computer host, and a sixth output terminal of the third metal-oxide-semiconductor field-effect transistor is connected with a third signal contact of the circuit board, wherein when the third light beam is received by the third metal-oxide-semiconductor field-effect transistor, the third metal-oxide-semiconductor field-effect transistor is closed, wherein when both of the second metal-oxide-semiconductor field-effect transistor and the third metal-oxide-semiconductor field-effect transistor are closed, the communication circuit is enabled, so that the computer communication protocol information is transmitted to the circuit board and the device communication protocol information is transmitted to the computer system.

2. The circuit board testing system according to claim 1, wherein the computer system comprises:

a computer host connected with the data acquisition unit and the connection module, wherein a default voltage range is previously stored in the computer host, wherein according to the default voltage range, the computer host judges whether the circuit board is qualified or not; and a display screen connected with the computer host and showing a test result of the circuit board, wherein after the real voltage value is received by the computer host, the computer host judges whether the real voltage value is within the default voltage range or not, wherein if the real voltage value is not within the default voltage range, the computer host determines that the electronic component is unqualified, and a failed test message is shown on the display screen, wherein if the real voltage value is within the default voltage range, the computer host determines that the electronic component is qualified, and a pass test message is shown on the display screen.

3. The circuit board testing system according to claim 1, wherein the switching circuit comprises:

a fixed resistor corresponding to the electronic component, wherein the fixed resistor is connected with an analog output pin of the data acquisition unit;

a single-pole-single-throw relay, wherein a normally closed terminal of the single-pole-single-throw relay is connected with the fixed resistor, and a common terminal of the single-pole-single-throw relay is connected with the electronic component and the analog input pin; and a driving circuit connected with the data acquisition unit and the single-pole-single-throw relay, wherein the connection module or the single-pole-single-throw relay is enabled by the driving circuit in response to the start voltage, wherein when the connection module is enabled, an electrical connection between the circuit board and the computer system is established, and the circuit board is powered on, so that the real voltage value of the electronic component is acquired by the analog input pin of the data acquisition unit.

4. The circuit board testing system according to claim 1, wherein the switching circuit comprises:
- a first fixed resistor corresponding to the electronic component, wherein the first fixed resistor is connected with an analog output pin of the data acquisition unit;
- a second fixed resistor corresponding to a second electronic component, wherein the second fixed resistor is connected with the analog output pin;
- a double-pole-double-throw relay, wherein a first normally closed terminal of the double-pole-double-throw relay is connected with the first fixed resistor, and a second normally closed terminal of the double-pole-double-throw relay is connected with the second fixed resistor, wherein a first common terminal of the double-pole-double-throw relay is connected with the electronic component and the analog input pin, and a second common terminal of the double-pole-double-throw relay is connected with the electronic component and a second analog input pin of the data acquisition unit; and
- a driving circuit connected with the data acquisition unit and the double-pole-double-throw relay, wherein the connection module or the double-pole-double-throw relay is enabled by the driving circuit in response to the start voltage, wherein when the connection module is enabled, an electrical connection between the circuit board and the computer system is established, and the circuit board is powered on, so that the real voltage value of the electronic component is acquired by the analog input pin of the data acquisition unit and a second real voltage value of the second electronic component is acquired by the second analog input pin of the data acquisition unit.

5. The circuit board testing system according to claim 1, wherein the switching circuit comprises:
- a fixed resistor corresponding to the electronic component; and
- an optical relay connected with the data acquisition unit and the fixed resistor, wherein in response to the start voltage, the optical relay is enabled, so that the electronic component and the fixed resistor are collaboratively defined as an equivalent circuit, wherein the optical relay comprises:
- a fourth light emitter, wherein a seventh input terminal of the fourth light emitter is connected with the data acquisition unit, an eighth input terminal of the fourth light emitter is connected with a ground terminal, and the fourth light emitter emits a fourth light beam in response to the start voltage; and
- a fourth metal-oxide-semiconductor field-effect transistor, wherein a seventh output terminal of the fourth metal-oxide-semiconductor field-effect transistor is connected with the fixed resistor, an eighth output terminal of the fourth metal-oxide-semiconductor field-effect transistor is connected with the data acquisition unit, wherein when the fourth light beam is received by the fourth metal-oxide-semiconductor field-effect transistor, the fourth metal-oxide-semiconductor field-effect transistor is closed, so that the optical relay is enabled, wherein when the optical relay is enabled, the electronic component and the fixed resistor are collaboratively defined as the equivalent circuit, wherein when the connection module is enabled, an electrical connection between the circuit board and the computer system is established, and the circuit board is powered on, so that the real voltage value of the electronic component is acquired by an analog input pin of the data acquisition unit.

* * * * *